United States Patent
Buckwalter et al.

(10) Patent No.: US 11,914,263 B2
(45) Date of Patent: Feb. 27, 2024

(54) ANALOG PREDISTORTION LINEARIZATION FOR OPTICAL FIBER COMMUNICATION LINKS

(71) Applicant: The Regents of the University of California, Oakland, CA (US)

(72) Inventors: James F. Buckwalter, Santa Barbara, CA (US); Navid Hosseinzadeh, Goleta, CA (US); Aditya Jain, Goleta, CA (US); Roger Helkey, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 237 days.

(21) Appl. No.: 17/437,979

(22) PCT Filed: Mar. 10, 2020

(86) PCT No.: PCT/US2020/021899
§ 371 (c)(1),
(2) Date: Sep. 10, 2021

(87) PCT Pub. No.: WO2020/185783
PCT Pub. Date: Sep. 17, 2020

(65) Prior Publication Data
US 2022/0187675 A1    Jun. 16, 2022

Related U.S. Application Data

(60) Provisional application No. 62/818,267, filed on Mar. 14, 2019.

(51) Int. Cl.
*G02F 1/225* (2006.01)
*G02F 1/21* (2006.01)
(Continued)

(52) U.S. Cl.
CPC ............ *G02F 1/2255* (2013.01); *G02F 1/212* (2021.01); *H03F 1/32* (2013.01); *H03F 3/189* (2013.01); *H03F 2200/451* (2013.01)

(58) Field of Classification Search
CPC ................................ G02F 1/2255; G02F 1/212
See application file for complete search history.

(56) References Cited

U.S. PATENT DOCUMENTS 5,210,633 A * 5/1993 Trisno ................... H03F 1/3252
398/186
5,963,352 A * 10/1999 Atlas .................. H04B 10/5051
398/193
(Continued)

OTHER PUBLICATIONS

International Search Report and Written Opinion from the corresponding International Patent Application No. PCT/US2020/021899, dated May 7, 2020.
(Continued)

*Primary Examiner* — Sung H Pak
(74) *Attorney, Agent, or Firm* — Greer, Burns & Crain, Ltd.; Steven P. Fallon

(57) ABSTRACT

A predistorter for an electro-optical converter includes a plurality of low noise RF amplifiers distributed along a transmission line that receive an RF input. Second order intermodulation injection (IM2) circuitry includes an inductively-degenerated frequency doubler to square and filter IM2 products of the RF input. A Mach-Zehnder Modulator (MZM) is used for electro-optical conversion. Feed forward circuitry injects IM2 to independently propagate RF intermodulation components with velocity matching to the MZM. At least one driver injects the RF input and RF intermodulation components into the MZM.

15 Claims, 12 Drawing Sheets

(51) Int. Cl.
    *H03F 1/32*     (2006.01)
    *H03F 3/189*    (2006.01)

(56) References Cited

U.S. PATENT DOCUMENTS 7,466,925 B2    12/2008   Iannelli
7,899,276 B2    3/2011    Kucharski et al.

OTHER PUBLICATIONS

Huynh et al., "Flexible Transmitter Employing Silicon-Segmented Mach-Zehnder Modulator With 32-nm CMOS Distributed Driver", Journal of Lightwave Technology, 2016, pp. 5129-5136, vol. 34, No. 22, IEEE.

Moazeni et al., "A 40Gb/s PAM-4 Transmitter Based on a Ring-Resonator Optical DAC in 45nm SOI CMOS", 2017 IEEE International Solid-State Circuits Conference, 2017, pp. 486-488, IEEE.

Zhu et al., "Ultra Broadband Predistortion Circuit for Radio-over-Fiber Transmission Systems", Journal of Lightwave Technology, 2016, pp. 5137-5145, vol. 34, No. 22, IEEE.

\* cited by examiner

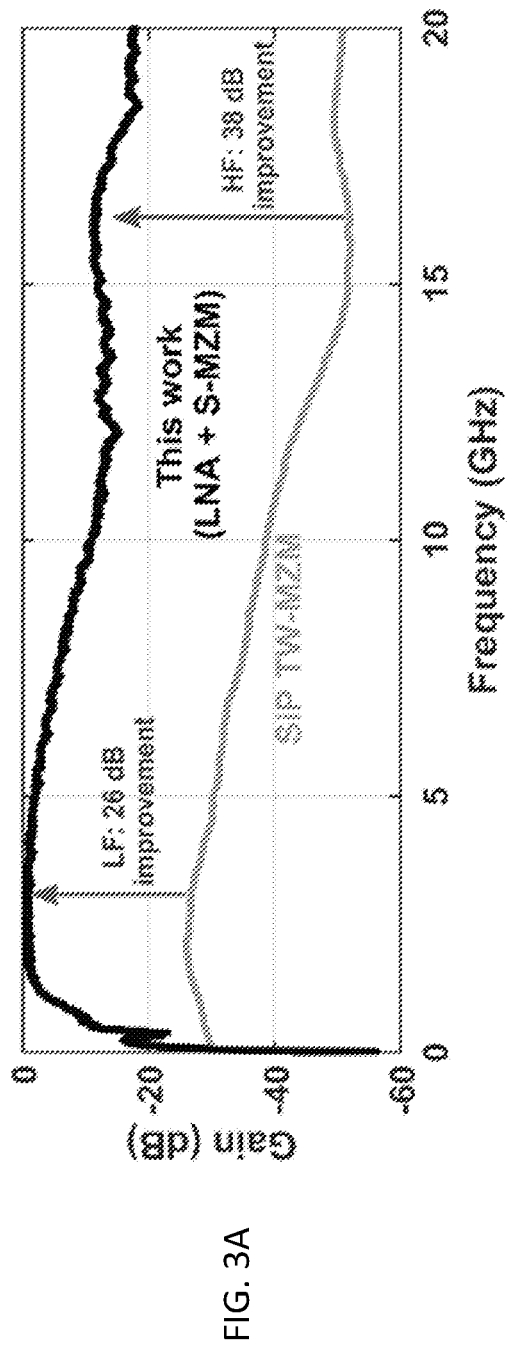
FIG. 3A
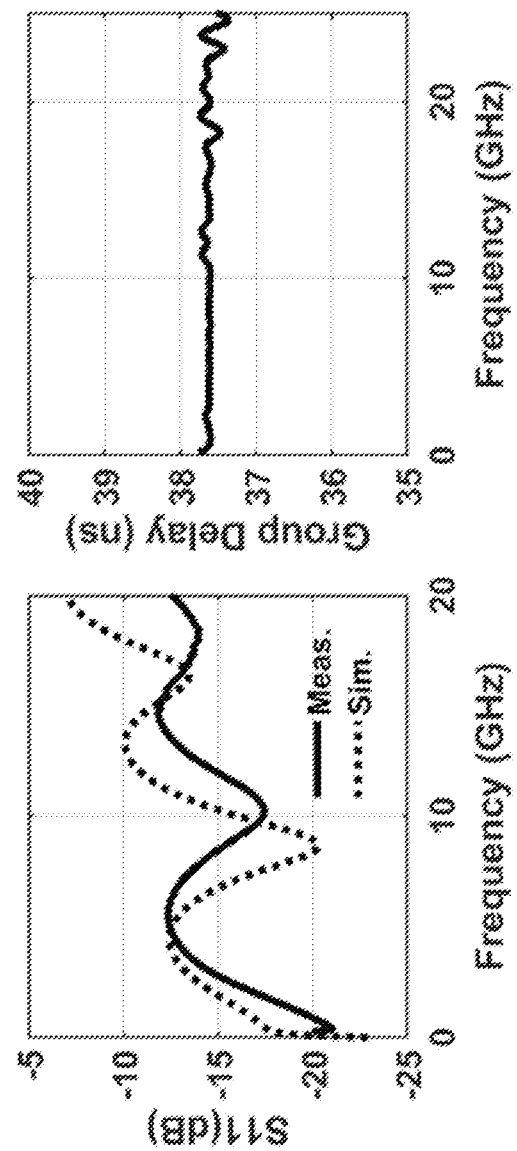
FIG. 3B
FIG. 3C

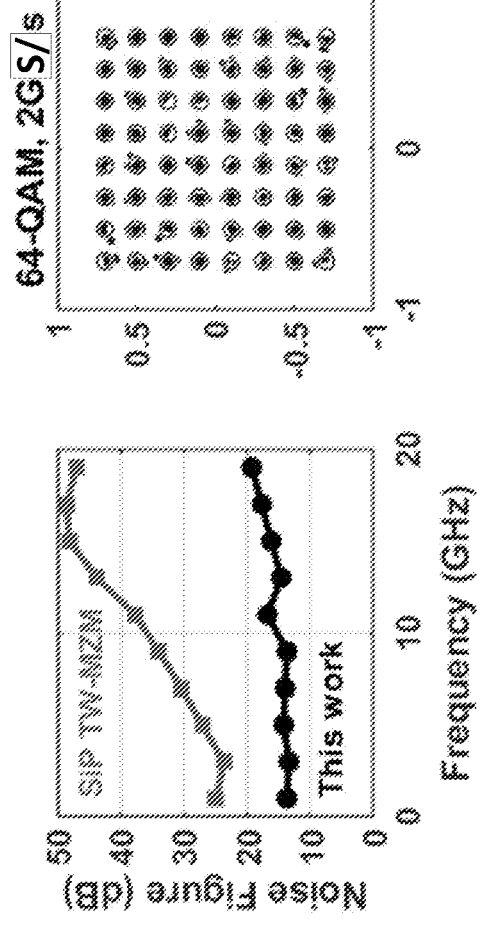
FIG. 6A
FIG. 6B
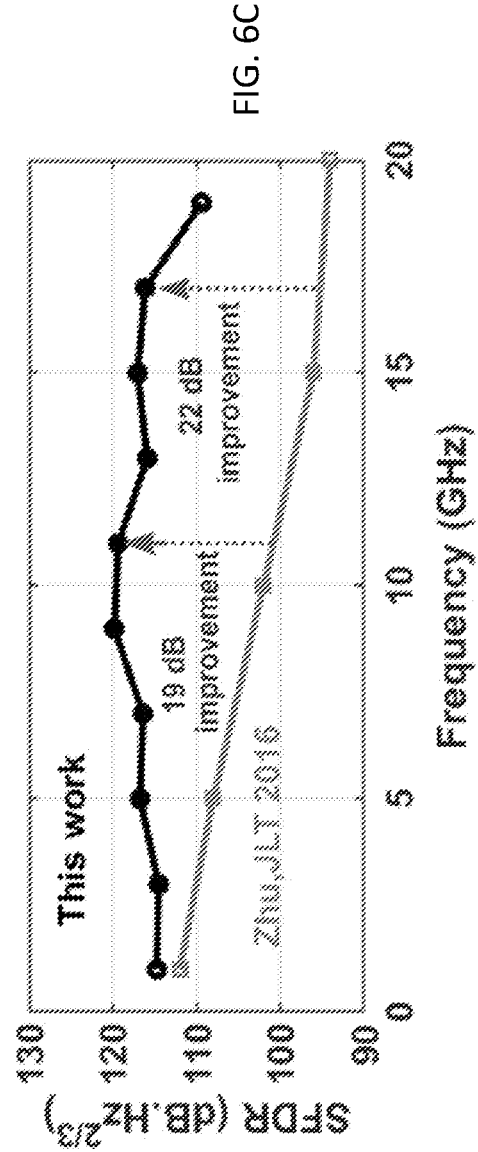
FIG. 6C

ANALOG PREDISTORTION LINEARIZATION FOR OPTICAL FIBER COMMUNICATION LINKS

PRIORITY CLAIM AND REFERENCE TO RELATED APPLICATION

The application claims priority under 35 U.S.C. § 119 and all applicable statutes and treaties from prior provisional application Ser. No. 62/818,267, which was filed Mar. 14, 2019.

STATEMENT OF GOVERNMENT INTEREST

This invention was made with government support under grant number FA8650-15-2-5220 awarded by the U.S. Air Force Research Laboratory. The government has certain rights in the invention.

FIELD

Fields of the invention include imaging, sensing, communications and wireless communications via optical fiber links. An example application of the invention includes linearization of the nonlinear transfer function of an electro-optical modulator in a Radio-over-Fiber (RoF) link. The invention is generally applicable to fiber communication links, and a particular contemplated application is to an antenna remoting system that uses optical fiber links to cover an environment with a 5G wireless signal. Also linear fiber optic links can replace bulky and heavy coaxial cables in vehicles, buildings and machinery or other devices, providing a lightweight communication link that is also immune to electromagnetic interference, features a coaxial cable based link lacks.

Abbreviation List

The following abbreviations are used frequently to improve readability of the written description.
BW Bandwidth
dB Decibel
E/O Electro-Optical
IIP Input Intercept Point
IIP3 $3^{rd}$ Order Input Intercept Point
IM2 Second Order Intermodulation Distortion Component
IM3 Third Order Intermodulation Distortion Component
L Length
LNA Low Noise Amplifier
MDS Minimum Detectable Signal at 1-Hz
MZM Mach-Zehnder Modulator
NF Noise FIG.
O/E Opto-Electrical
RF Radio Frequency
RoF Radio-over-Fiber
Seg-MZM Segmented MZM
SFDR Spurious Free Dynamic Range
SiP Silicon Photonics
TIA Transimpedance Amplifier
TW Travelling Wave
Vπ Voltage Change for 180° Optical Carrier Phase Change
W IM3 Weight

BACKGROUND

Emerging 5G technology will include use of antenna remoting techniques to cover an environment (e.g., a room, a building floor) with wireless signal. Signal can be distributed to and from all antennas with electrical cables or fiber links. The main disadvantage with electrical cables is the high loss, especially at high frequencies. Fiber links, on the other hand have negligible loss but suffer from low SFDR due to the nonlinearity of optical modulator(s) that convert electrical signals into (electro-optical conversion) and out of (optical-electrical conversion) the optical fibers. MZMs are extensively used in RoF links. A drawback of the MZM is its nonlinear characteristic, which results in the low limited dynamic range. Other electro-optical modulators that can suffer from low SFDR include ring and electro-absorption modulators.

RoF links are useful in environments where antenna remoting improves RF signal coverage over a large area. RoF links capture signals over large instantaneous frequency ranges, transport these signals over low-loss fiber optics, and become increasingly useful as communication and radar bands reach into the millimeter-wave regime, where high path loss reduces the cell size and range.

A conventional RoF link consists of an E/O conversion generated with a MZM and O/E conversion using a photo-diode. The ability of the RoF link to handle interference is characterized by the IIP3 which is limited by nonlinearity in the E/O and O/E components. The IIP3 can be characterized for the E/O modulator and is proportional to the Vπ of an MZM. Unfortunately, large Vπ also reduces the link gain and noise figure. Therefore, a critical problem for RoF links is maximizing SFDR of the MZM, defined by IIP3−MDS. Prior work on RoF links indicates the SFDR reduces with frequency, particularly as links operate in millimeter-wave bands. Typical wireless systems require 120 dB·$Hz^{2/3}$ SFDR. Prior work indicates more than a 20 dB gap at 20 GHz between current MZM SFDR and this goal.

Despite its advantages in terms of cost and integration, SiP has not been viewed as an optimal material system for high-frequency, high-linearity MZMs. SiP has been employed to enable low-cost, high-yield digital communication links with hybrid integration of the MZM and driver [T. N. Huynh et al., "Flexible Transmitter Employing Silicon-Segmented Mach-Zehnder Modulator With 32-nm CMOS Distributed Driver," *Journal of Lightwave Technology*, vol. 34, no. 22, pp. 5129-5136, November 2016], and monolithic integration of a silicon ring modulator and driver [S. Moazeni et al., "A 40 Gb/s PAM-4 transmitter based on a ring-resonator optical DAC in 45 nm SOI CMOS," 2017 *IEEE International Solid-State Circuits Conference (ISSCC)*, pp. 486-487] using on-off keying modulation. However, such conventional SiP-based photonic demonstrations have limited SFDR due to multiple sources of nonlinearity.

One publication proposes predistortion to linearize a $LiNbO_3$ MZM for a 112 dB·$Hz^{2/3}$ SFDR at 1 GHz and decreasing to 94 dB·$Hz^{2/3}$ SFDR at 20 GHz [R. Zhu, X. Zhang, D. Shen and Y. Zhang, "Ultra Broadband Predistortion Circuit for Radio-over-Fiber Transmission Systems" *Journal of Lightwave Technology*, vol. 34, no. 22, pp. 5137-5145, November, 2016]. Drawbacks of this technique include low level of integration, high production cost and device to device variation. The system in the publication is limited to 20 GHz bandwidth. There is a trade-off between linearity and power consumption, so the linearization technique costs extra power consumption.

SUMMARY OF THE INVENTION

A predistorter for an electro-optical converter includes a plurality of low noise RF amplifiers distributed along a transmission line that receive an RF input. Second order intermodulation injection (IM2) circuitry includes an inductively-degenerated frequency doubler to square and filter IM2 products of the RF input. A Mach-Zehnder Modulator (MZM) is used for electro-optical conversion. Feed forward circuitry injects IM2 to independently propagate RF intermodulation components with velocity matching to the MZM. At least one driver injects the RF input and RF intermodulation components into the MZM.

A method for linearizing an electro-optical conversion includes receiving a radio frequency (RF) signal, distributing amplification along a single-ended transmission line, wherein a delay of the transmission line is matched to group velocity of light in a Mach-Zehnder Modulator (MZM), generating second order intermodulation injection (IM2) and independently propagating RF intermodulation components to with velocity matching with the MZM, and injecting the RF signal and the RF intermodulation components into the MZM. Broadband compensation is provided by preferred embodiments. The intermodulation components can be generated over more than an octave of the RF signal bandwidth, which preferably has a broadband range.

BRIEF DESCRIPTION OF THE DRAWINGS

FIGS. 3A-3C illustrates measured RoF link gain and group delay from S-parameters for a preferred embodiment consistent with FIG. 2E and a 4-segment MZM;

FIGS. 6A-6C are measured NF of the RoF link compared to the NF of a Si-based TW-MZM (FIG. 6A), Measured 64-QAM constellation at 2 GS/s (16 Gb/s) (FIG. 6B), and calculated SFDR from measurement data and comparison with prior work (FIG. 6C).

DETAILED DESCRIPTION OF THE PREFERRED EMBODIMENTS

Figure 1:
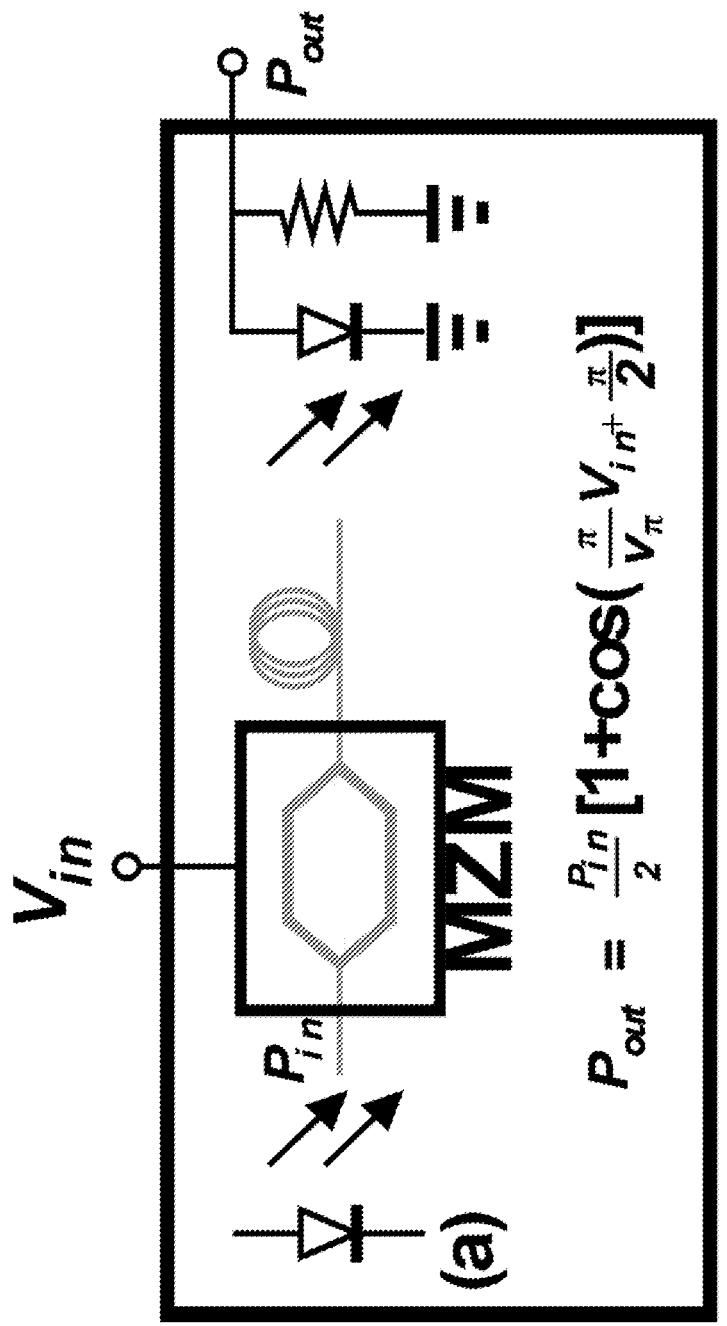
FIG. 1 (Prior Art) illustrates that conventional SFDR of RF over fiber links suffers from nonlinearity of the electro-optical modulator, in this case MZM. The cosine transfer function of the MZM limits the linearity of the system.

The present inventors have recognized a main drawback of previous RoF links is that they used discrete modules and expensive and bulky $LiNbO_3$ modulators. FIG. 1 (prior art) shows a problem of such modulators. Specifically, the SFDR of such RoF links suffers from nonlinearity of the electro-optical modulator. In the FIG. 1 example, the MZM contributes the nonlinearity. Specifically, the cosine transfer function of the MZM limits the linearity of the system.

Preferred embodiment systems improve linearity of such a system and can be implemented in a small silicon area and can be highly integrated. In addition, the present invention can also be used to linearize prior bulky $LiNbO_3$ modulators.

Preferred method of the invention integrate Si/SiGe-based electronics and Si-based RF photonics to linearize the RoF link into microwave bands without requiring more expensive $LiNbO_3$ MZMs. A preferred embodiment is an analog predistortion method to linearize a modulator signal and achieve high SFDR RoF links in silicon technology, though the method can also be applied to other electro-optical modulators, including the $LiNbO_3$ MZMs. In preferred embodiments, the predistorter is wideband, suitable for large scale integration and is implanted in silicon technology, avoiding prior heavy and bulky predistorters. The invention can linearize the nonlinear transfer function of an MZM as well as determine the noise figure of the link. Preferred embodiments are implemented in Silicon photonics technology, which offer low-cost and large-scale integration compared to other technologies that require $LiNbO_3$, InP and GaAs.

A preferred method provides a distributed injection of intermodulation distortion (either second or third-order intermodulation distortion) injection for broadband operation, with a low noise driver and demonstrates an SFDR as high as 120 $dB \cdot Hz^{2/3}$ at 10.5 GHz, a 19 dB improvement over previous RoF links based on $LiNbO_3$ MZMs, while requiring only 60 mW of additional power consumption. A low noise driver or low noise amplifier is a circuit used for amplifying very small signals. NF is the metric that measures amplifier noise. Typically, NF for low noise drivers/amplifiers is less than 5 dB.

A preferred RF circuit is broadband, e.g., it operates between 1-20 GHz. Predistortion of preferred embodiments provides improvement over broadband range of frequencies, e.g. more than an octave, and is therefore broadband predistortion. Preferred embodiments provide improvements over multiple octaves, e.g. three or four octaves.

Without being bound to the theory or the theory being necessary to distinguish the invention, preferred embodiments provide what is believed to be the first co-designed linearized driver for an RoF link. Additionally, the driver can achieve a record 120 $dB \cdot Hz^{2/3}$ SFDR at 10.5 GHz and a response above 110 dB·Hz to 18 GHz. One fundamental issue with SiP MZMs is the $V\pi \cdot L$ product. Long MZMs (>1 cm) result in lower $V\pi$ but produce significant frequency-dependent losses in a TW MZM. Preferred embodiments avoid this issue by employing a SiP-based Seg-MZM to reduce the frequency roll-off, and other embodiments provide a predistortion distributed driver for segmented modulators that reduces losses in the traveling wave MZM or other electro-optical modulators.

Preferred embodiments of the invention will now be discussed with respect to the drawings and with respect to experiments. The drawings may include schematic representations, which will be understood by artisans in view of the general knowledge in the art and the description that follows. Features may be exaggerated in the drawings for emphasis, and features may not be to scale.

Figure 2A:
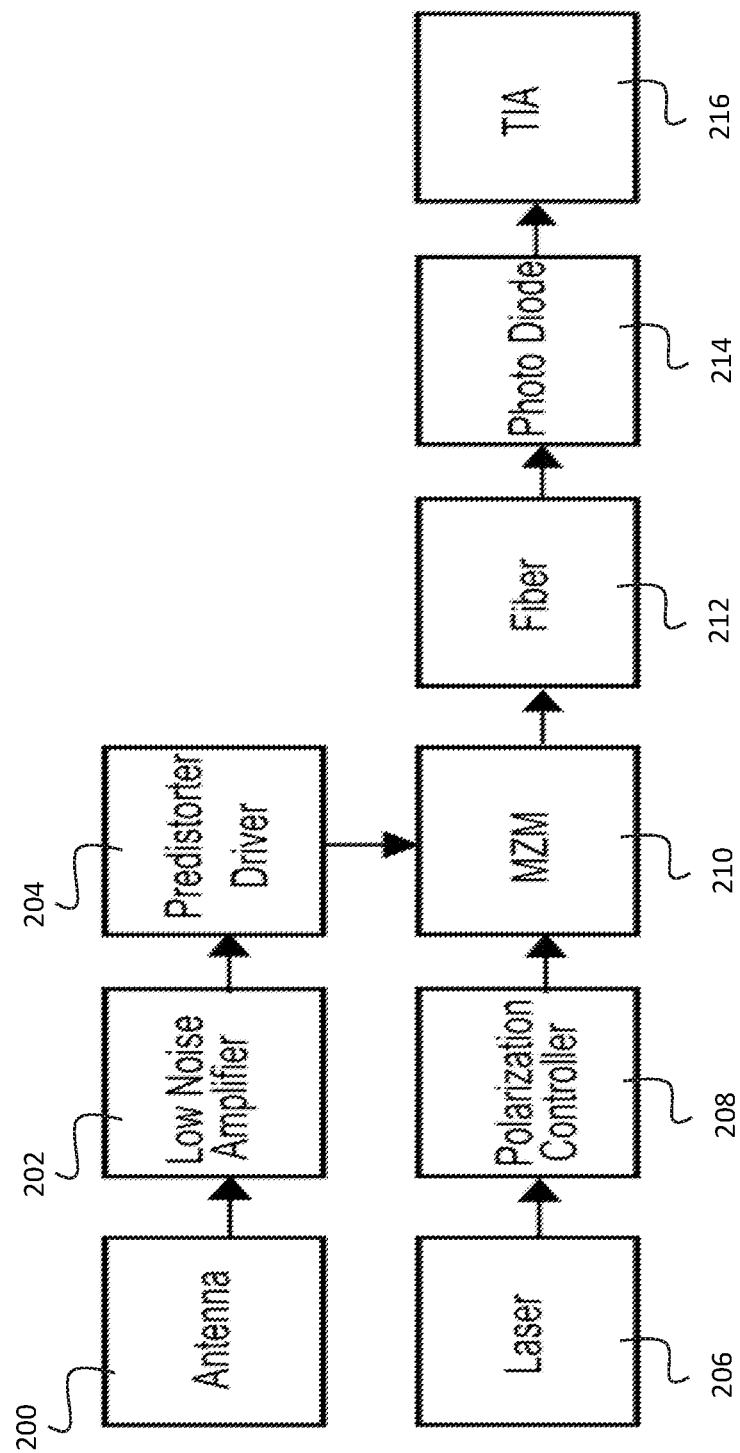
FIG. 2A is a block diagram of a preferred RF over fiber system that is linearized using an analog predistorter driver.

FIG. 2A shows a preferred embodiment RoF circuit. An antenna 200 receives an RF signal, which is amplified by an LNA 202, which then is amplified again and distorted in a predistorter driver 204. A laser 206 provides an optical carrier. A polarization controller 208 matches optical carrier polarization to the polarization of an MZM electro-optical modulator 210, which converts electric signal to a amplitude modulated optical wave. Fiber 212 transports the modulated optical wave to a desired location. A photo diode 214 converts the modulated optical signal to an electric current. A TIA 216 amplifies the output current of the photodiode and converts it into a voltage signal.

Figure 2C:
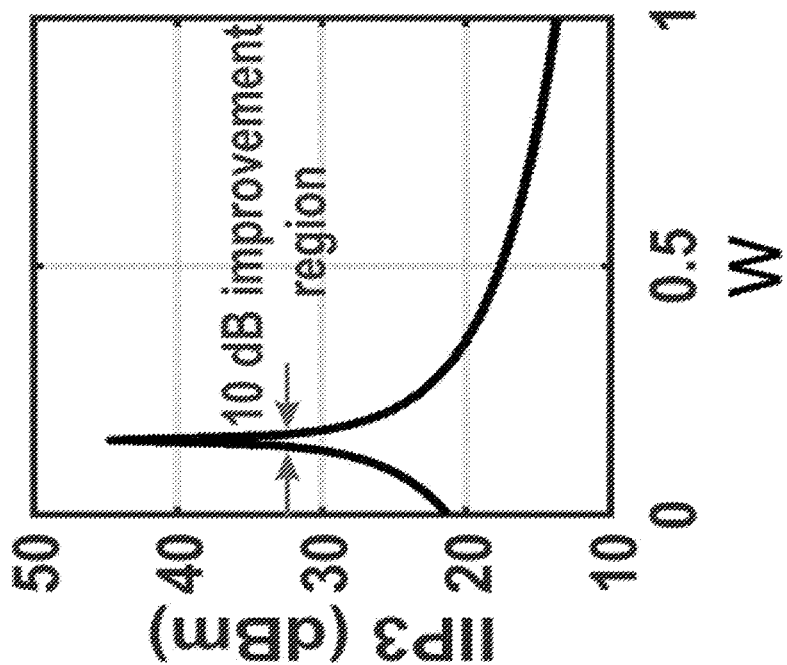
FIG. 2B illustrates a preferred architecture of the predistorter driver of FIG. 2A, using a segmented MZM modulator, and FIG. 2C an associated IIP3 increase with IM3 weight.
FIG. 2D illustrates a preferred architecture of the predistorter driver of FIG. 2A, using a travelling wave MZM modulator.
FIG. 2E illustrates a preferred multi-stage distributed IM3-injection for a segmented MZM driver.
FIG. 2F illustrates a preferred independent multi-stage distributed IM3 generation for a travelling wave MZM
FIG. 2G illustrates a specific preferred circuit for the components of FIG. 2E or 2F.
FIG. 2H illustrates a preferred embodiment using a ring modulator, a travelling wave modulator or a combination thereof.
Figure 2B:
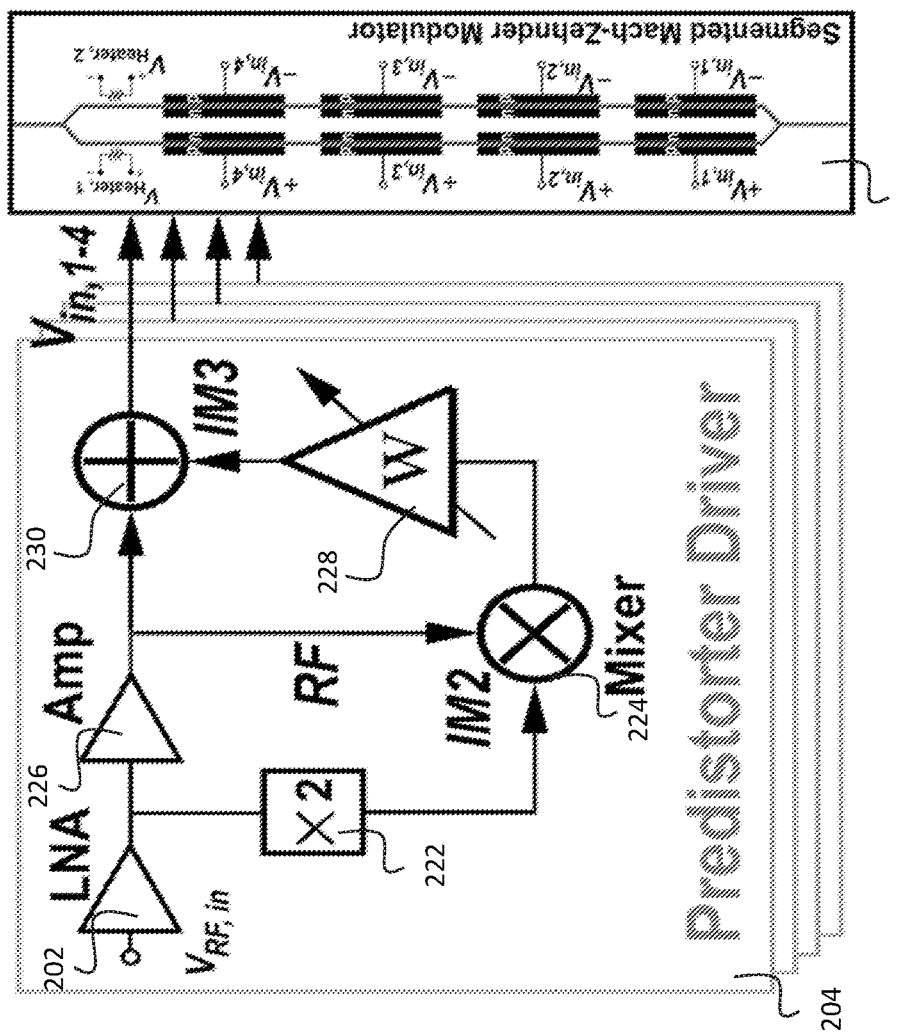

FIG. 2B illustrates a preferred architecture for the predistorter driver 204. In FIG. 2B, the predistorter driver 204 mixes an IM2 signal (x2 of the fundamental) with the fundamental to produces IM3. Because a preferred Seg-MZM 220 in FIG. 2B has 4 inputs, the predistorter driver 204 is distributed to have 4 outputs, each driving one segment of the Seg-MZM 220. These 4 layers provide the same signal with a specific time delay at each segment. Each layer defines a separate signal path in the driver. The signals are identical expect for each layer's specific time delay. The number of paths (layers) is determined by number of input terminals on the Seg-MZM 220. In the predistorter driver 204, an IM3 is created by squaring 222 a signal from the LNA 202 and then multiplying it in a mixer 224 again by a version of itself that has been amplified by an amplifier 226. The IM3 signal is weighted 228, added 230 back into the RF signal and applied to the Seg-MZM 220.

The Seg-MZM 220 is a four-segment MZM. Four is a preferred number of segments to balance power consumption and bandwidth. More segments can be used at the expense of power. Fewer segments can be used at the expense of longer segments and thus narrower bandwidth.

Figure 2D:
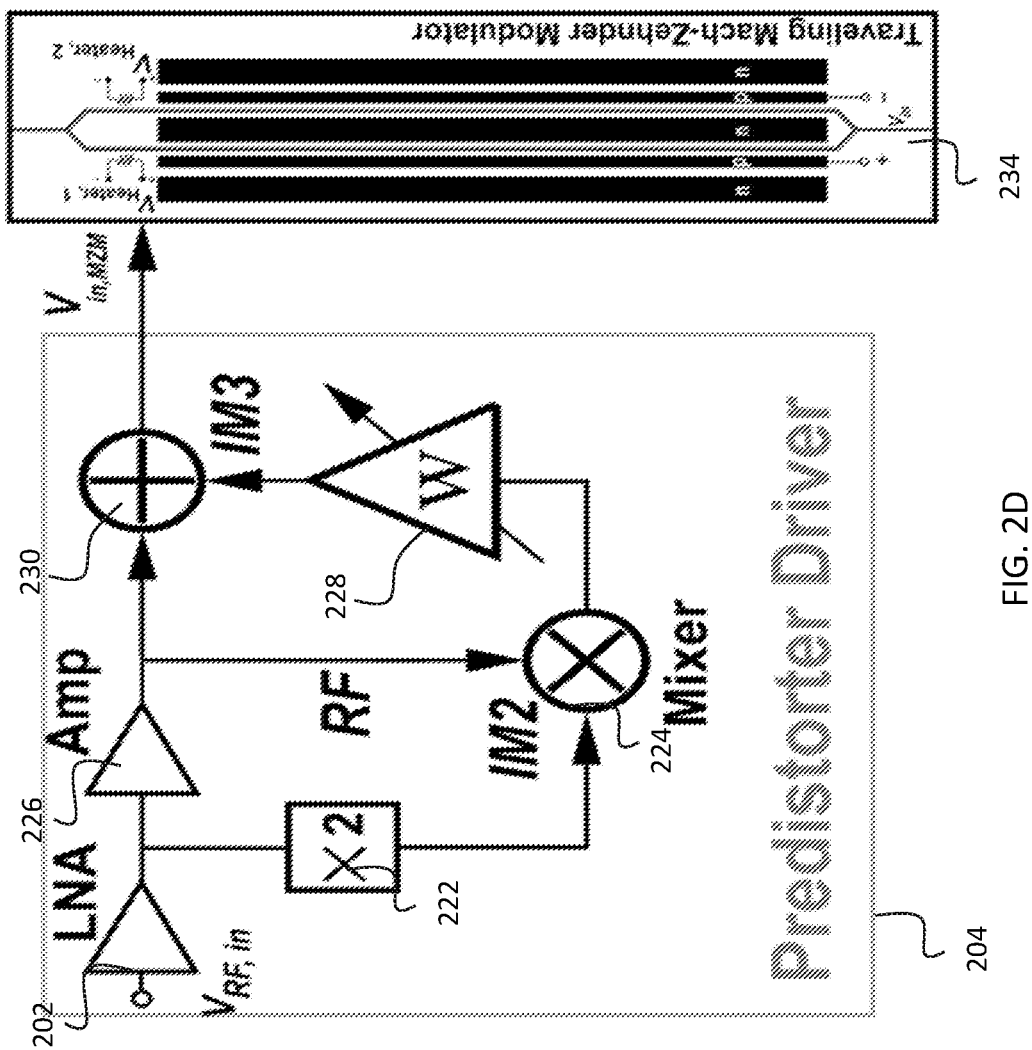

FIG. 2D shows a variation with a TW MZM 234. In this instance, the predistorter 204 driver performs the same function but only a single layer is required in the predistorter 204 because the travelling wave MZM 234 has a single input. The segmented MZM 220 is preferred for a silicon fabrication to improve bandwidth. The traveling wave MZM 234 design of FIG. 2C is preferred other materials, such as III-V modulators where length doesn't need to be very long, or when constraints on bandwidth are more relaxed.

The FIG. 2A circuit with the FIG. 2B predistorter 204 has been fabricated in a 65-nm Silicon photonic process with a p-i-n phase shifter waveguide to confine the optical field and linearize the MZM response through a combined plasma dispersion/Kerr effect modulation [E. Timurdogan, C. Poulton, M. Byrd and M. Watts, "Electric field-induced second-order nonlinear optical effects in silicon waveguides", *Nature Photonics*, vol. 11, no. 3, pp. 200-206, 2017]. The E. Timurdogan et al. publication describes a new phase shifter that improves linearity of the MZM, by improving the linearity of the phase shifter. That phase shifter is used in preferred embodiments of the present invention. The segmented MZM (S-MZM) potentially improves the 3-dB bandwidth compared to a TW-MZM but remains limited to SFDR of around 100 dB·Hz$^{2/3}$ at 1 GHz. To increase the SFDR by 20 dB preferred embodiments also include an active driver to improve the noise figure and increase the IIP3.

The optical transfer function of the traveling wave MZM of length L is $$\frac{P_{OUT}}{P_{IN}} = \frac{e^{-\alpha L}}{2}\left(1 + \cos\left(\frac{V_{RF}}{V_\pi} + \frac{\pi}{2}\right)\right) \quad (1)$$

where α is the optical attenuation in the waveguide, $P_{IN}$ is the input optical power of the modulator, $P_{OUT}$ is the output optical power of the modulator, and $V_{RF}$ is the input RF signal applied to the modulator. Consequently, the IIP3 of the MZM is $$IIP3_V = \frac{2\sqrt{2V_\pi}}{\pi}$$

Along with Vπ, other factors in SiP processes impacting the IIP3 include the refraction index nonlinearity and C-V variation. For a given Vπ, SiP MZMs will be relatively longer (<4 mm) than III-V MZMs incurring significant frequency-dependent traveling wave (TW) losses. To overcome these losses, the TW MZM is preferably broken into several segments. The segmented MZM (S-MZM) mitigates high-frequency roll-off in microwave bands.

The FIG. 2B predistorter is applied to the four-segment MZM 220, where each segment of the MZM 220 includes a differential p-i-n optical phase shifter to confine the optical field in the waveguide and linearize the MZM response through a combination of plasma dispersion and Kerr effect modulation. While the S-MZM improves the 3-dB bandwidth compared to a TW-MZM, it does not improve the SFDR beyond 110 dB·Hz$^{2/3}$ at 1 GHz. Increasing SFDR further is achieved with active linearization approach to improve IIP3 that does not penalize NF in accordance with the present predistortion.

Segmenting the MZM allows a mechanism to linearize the optical response in (1) through an analog predistortion scheme. With reference to FIG. 2B, the RF signal is tapped off from a TW line at each segment and buffered to set the NF. The signal can then be split between two paths. In one path, the RF signal is amplified by the amplifier 226 while through an auxiliary path the RF signal is squared by square function 222 and low-pass filtered to generate a low-frequency IM2 component. Next, the IM2 component is mixed by the mixer 224 with the original RF signal to generate an IM3 component (third order intermodulation distortion component) that can be weighted 222 and added 230 to the original RF signal to cancel the IM3 components generated by the MZM. By adjusting the IM3 weight (w), the inherent MZM IIP3 can theoretically be increased substantially as illustrated in FIG. 2B. The graph of FIG. 2B neglects second order non-idealities. In reality these non-idealities will reduce the overall improvement, but the graph nonetheless is an accurate illustration of a large improvement achieved to our knowledge, this is the first demonstration of a wideband IM3 injection to compensate for the intrinsic nonlinearity of the MZM.

Figure 2E:
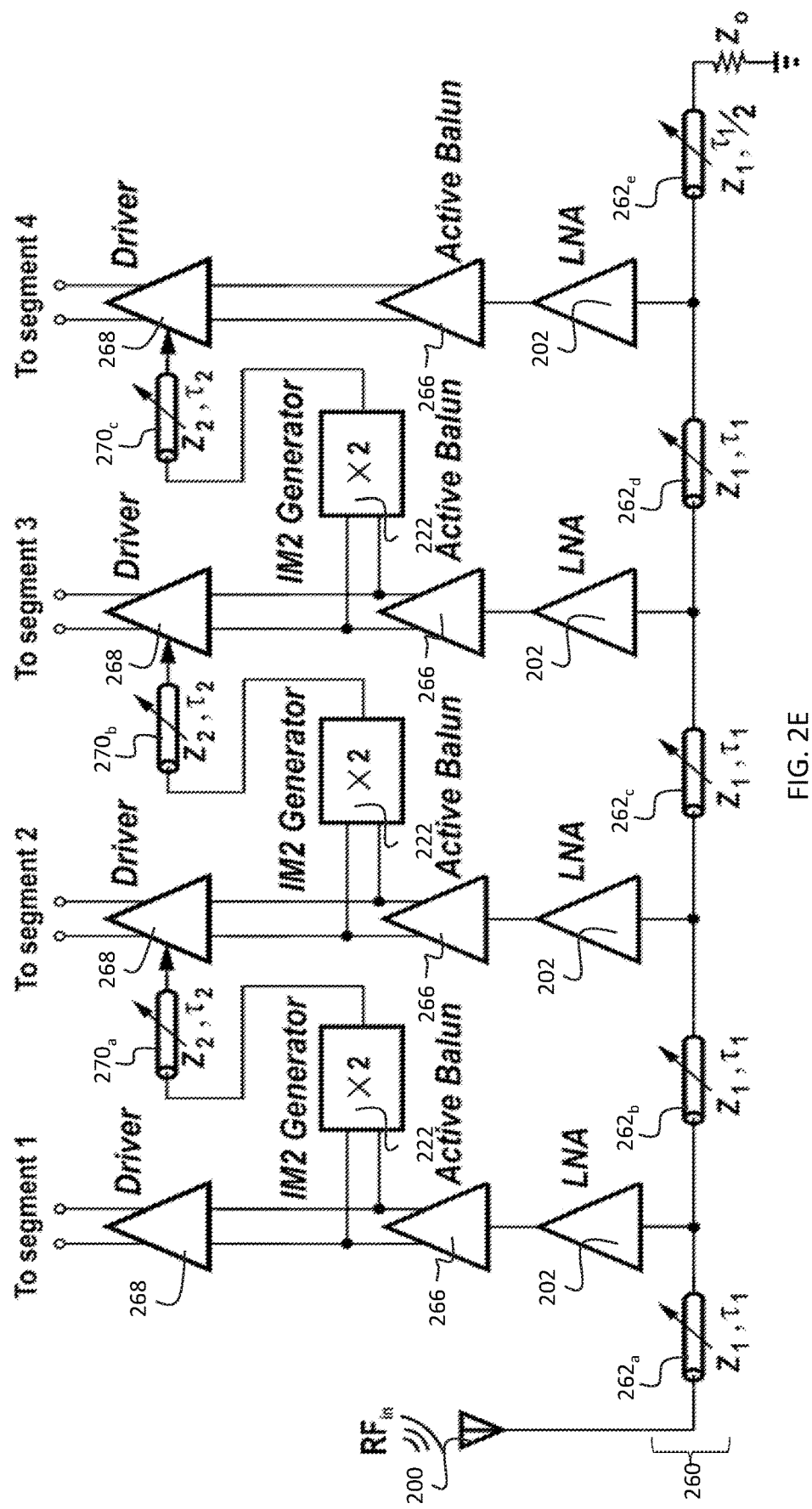

The circuit schematic of a preferred four-stage SiGe distributed IM3-injection low noise amplifier (LNA) is illustrated in FIG. 2E and is co-designed specifically for the SiP S-MZM stages. The same reference numbers are used from FIG. 2B are used for the same parts. In addition, the circuit includes a tunable delay artificial transmission line 260 with a tunable elements 262a-e. The transmission line provides signals delayed to respective LNAs. In addition to the IM2 generators 222, active baluns 266 are used to produce a differential version of the signal over a wide bandwidth and linear drivers 268 the p-i-n phase shifter segments in the S-MZM 220. Another group of tunable delay elements 270$_{a-c}$ provide IM3 injection with controlled delay.

The active baluns 266, as mentioned, produce a differential version of the signal over a wide bandwidth. This contrasts with FIG. 2B, that includes a general predistorter of the invention that obtains x2 from the fundamental. The FIG. 2E approach has IM2 generated and forwarded to a subsequent driver where it is mixed with the signal to produce IM3 components. In FIG. 2E, the x2 222 is obtained from the output of the balun 266 by squaring differential signals. Artisans will appreciate that any frequency doubler or multiplier will square the signal, and the active balun of FIG. 2E is one option. The output of the balun is squared to produce an IM2 component. The IM3 injection is represented by the $Z_2$, $t_2$ injection $270_{a-c}$ to the drivers 268. An advantage of the distributed injection using a segmented modulator is that the IM3 component can be "forwarded" to the next stage to preserve the phase delay. The first stage drives the second, etc. In a traveling wave modulator, an extra time delay is inserted to equalize the phase delay and produce IM3 cancellation over a wide bandwidth, as discussed with respect to FIG. 2F. The wideband LNA 202 is preferably a resistively degenerated cascode stage with inductive peaking to extend the bandwidth. Resistive degeneration is used for broadband frequency response. The active balun 266 preferably produces differential RF signals with less than 1 dB amplitude and under 5 degrees of phase imbalance up to 25 GHz. A linear, high-voltage differential cascode driver 268 preferably amplifies the RF signal up to 2-Vpp to drive the p-i-n phase shifter segments in the S-MZM. The intermodulation components are generated independently on the electrical side, but in FIG. 2E are injected separately into segments of the S-MZM.

Figure 2F:
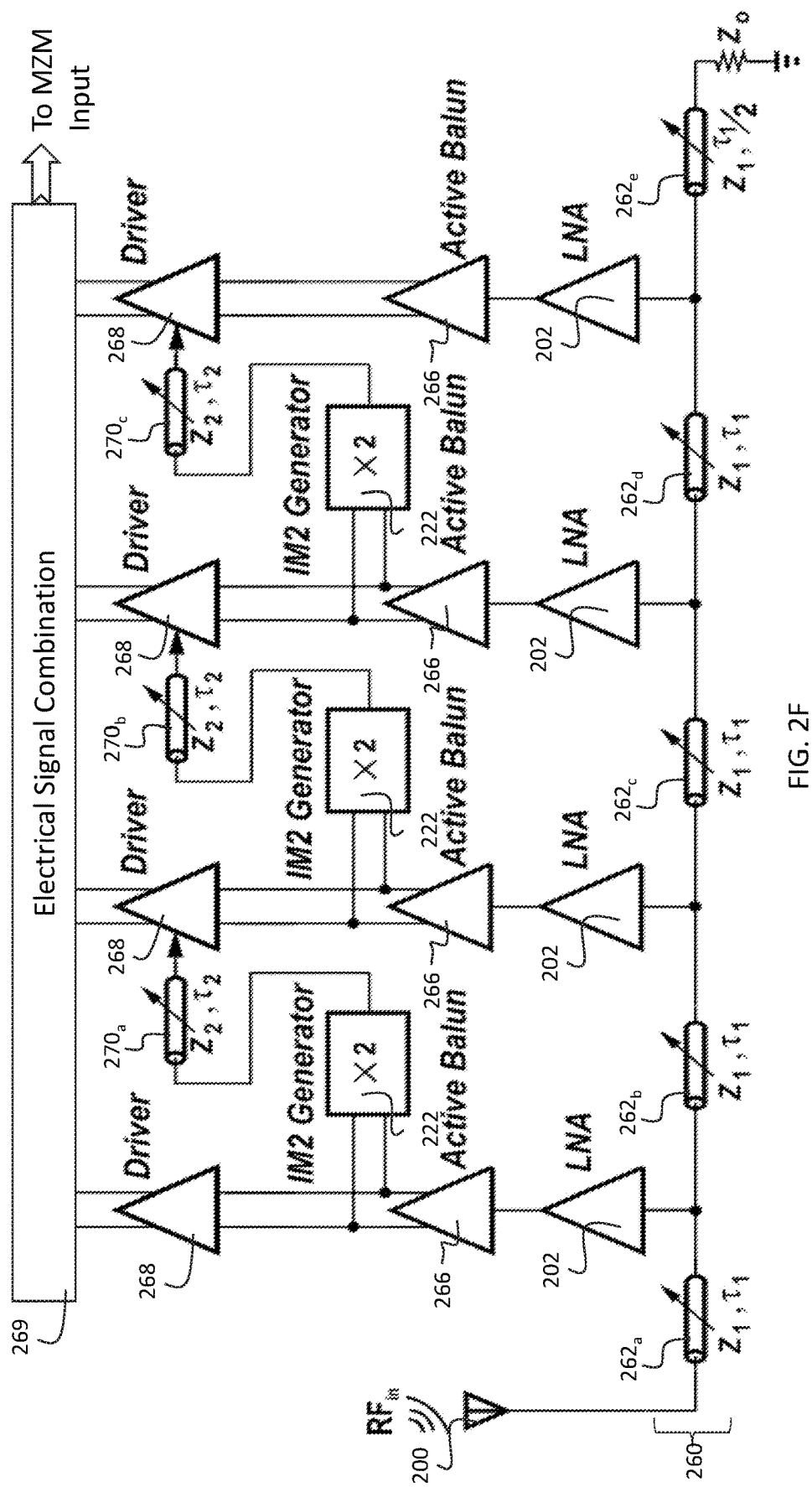

FIG. 2F illustrates that the benefits of FIG. 2E can be obtained and injected without a segmented S-MZM. Instead of generating intermodulation components and injecting them at different segments of an S-MZM, the components can be generated and combined on the electrical side via electrical signal combination 269 and then applied to the signal input of an MZM to obtain the same predistortion benefit. In this case, load inductor and resistor (RL) of drivers 268 can be moved out of the driver cell to the termination, similar to in a distributed amplifier.

Referring again to FIG. 2B, the IM3 injection circuitry taps the differential signals and uses an inductively-degenerated frequency doubler 222 to square and filter the IM2 products. The mixing and weighting functions 224 and 228 are produced by mirroring the IM2 current into the bias current of the high-voltage differential driver 268. Ignoring the emitter degeneration (RE) of the driver stage, the OIP3 of the linearized LNA is $$OIP3 \cong \frac{2R_L(I_{EE} + I_{BIAS})}{\sqrt{\left|\frac{3I_{BIAS}}{I_{EE} + I_{BIAS}} - 1\right|}} \quad (2)$$

where $I_{BIAS}$ is the DC current through the IM2 generator 222, $I_{EE}$ is the DC current of the differential driver stage 268, RL is the output load resistance. Consequently, the OIP3 is tuned through $I_{BIAS}$ and is optimized to cancel the MZM nonlinearity. The average simulated OIP3 of the driver is about 41 dBm, an increase of more than 10 dB in the absence of IM3 injection.

An example chip in accordance with FIGS. 2E and 2F was fabricated in a 130-nm SiGe BiCMOS process and distributes wideband low noise amplifiers (LNA) along a single-ended transmission line (TL). Since the TL delay must match the group velocity of light in the S-MZM for the segmented embodiment, a varactor adjusts the TL velocity. An active balun produces differential RF signals with less than 1 dB gain mismatch up to 25 GHz. A linear, high-voltage differential cascode driver amplifies 2-Vpp signal swing to drive the p-i-n phase shifter segments in the S-MZM, or are combined to drive the input of a travelling wave or another MZM. The IM2 injection circuitry taps the differential signals and uses an inductively-degenerated frequency doubler to square and filter the IM2 products. The weighting and mixing function are produced by supplying the frequency doubler current to the bias of the subsequent amplifier stage. The bias current of the IM2 injection is adjusted through the bias voltage of the doubler stage. By injecting this variation into the current of the differential driver, the IM3 components are reconstructed and added to the optical signal in the segmented-MZM.

Figure 2G:
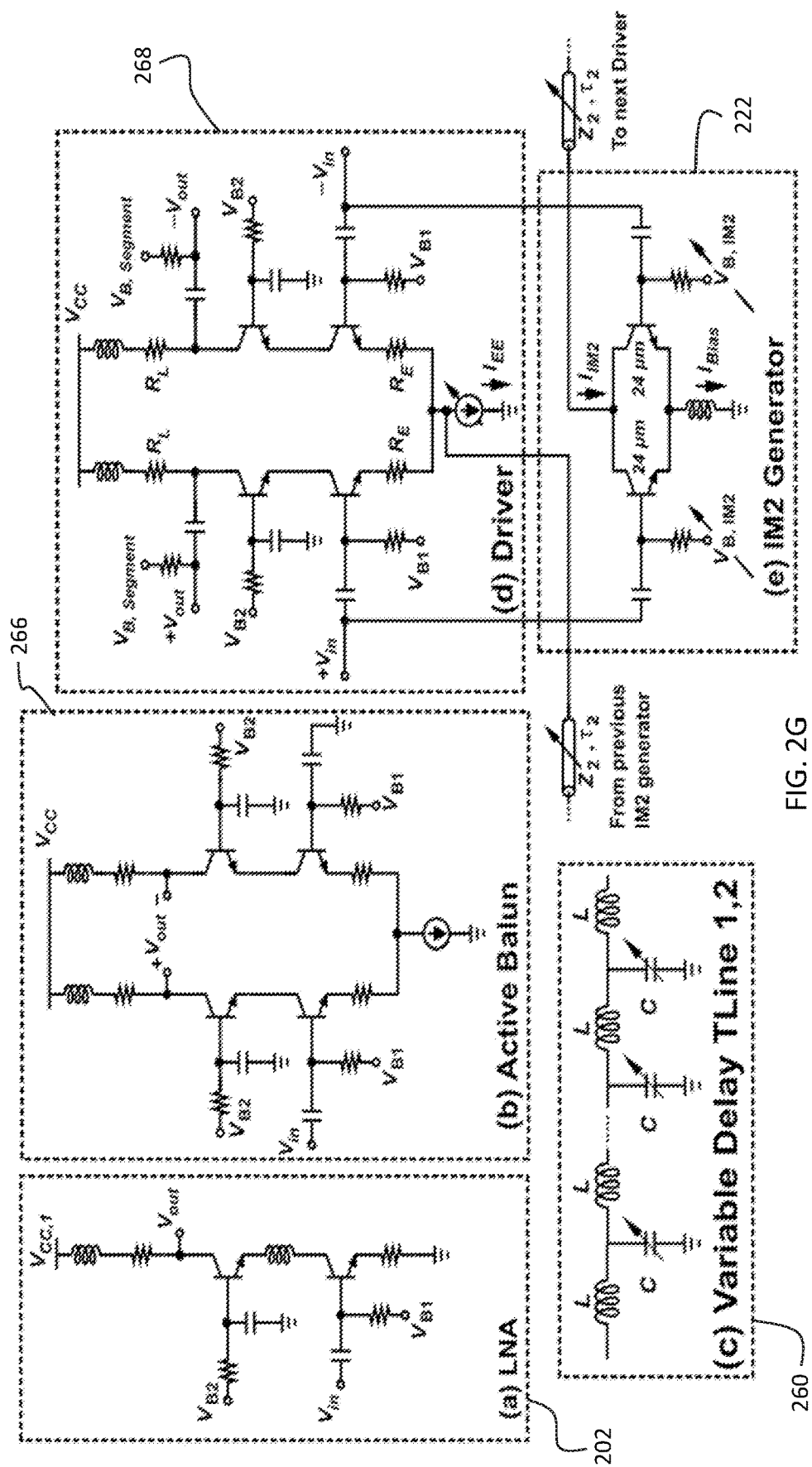

FIG. 2G shows preferred circuit components for the features in FIGS. 2E and 2F. The circuit schematic of the four-stage SiGe distributed IM3-injection low noise amplifier (LNA) 202 is co-designed specifically for the SiP Segmented-MZM stages. The wideband LNA 202 is a resistively degenerated cascode stage with inductive peaking to extend the bandwidth. Resistive degeneration is used for broadband frequency response. Next, the active balun 266 produces differential RF signals with less than 1 dB amplitude and under 5 degrees of phase imbalance up to 25 GHz. A linear, high-voltage differential cascode driver 268 amplifies the RF signal up to 2-Vpp to drive the p-i-n phase shifter segments in the S-MZM, when the circuit is used to drive an S-MZM.

Figure 2H:
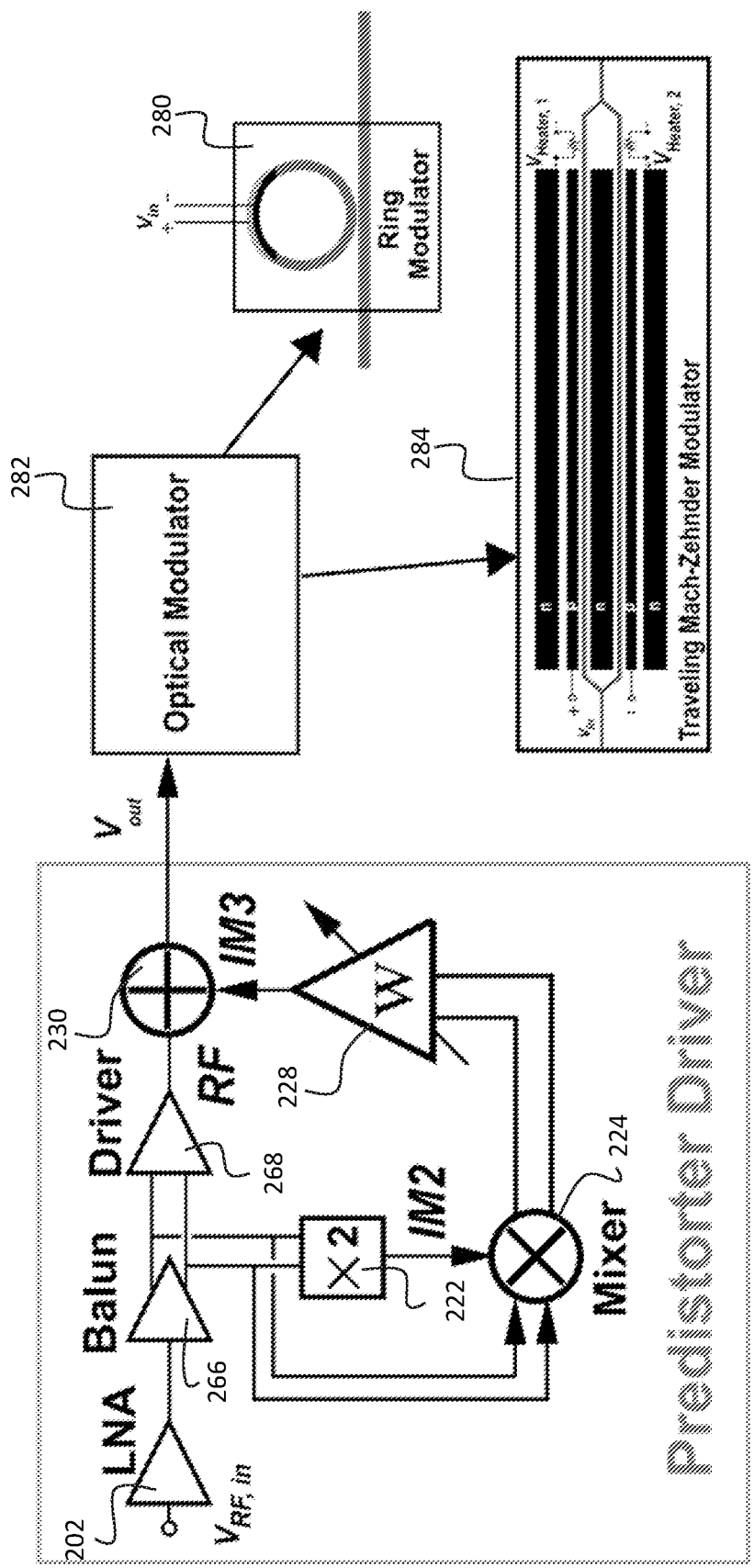

FIG. 2H illustrates that a ring modulator 280 is another alternative to a travelling wave modulator, generally depicted as an optical modulator 282. As the ring modulator has a single input, there is a single output from the predistorter, combined as described with respect to FIG. 2F. Another alternative is a combination of ring 280 and traveling wave MZM 284 modulators.

FIGS. 3A-3C plot the measured S-parameters (scattering parameters) for the RoF link with an external high-linearity photodiode. The link gain (FIG. 3A) is plotted in comparison to a driver-less Si-based TW-MZM. The active driver improves the gain by 26 dB at 3 GHz. The gain improves substantially above 15 GHz relative to the TW-MZM design. The simulated and measured input return loss in FIG. 3B is better than 10 dB to more than 20 GHz. The measured group delay in FIG. 3C also indicates low variation up to 24 GHz.

Figure 4:
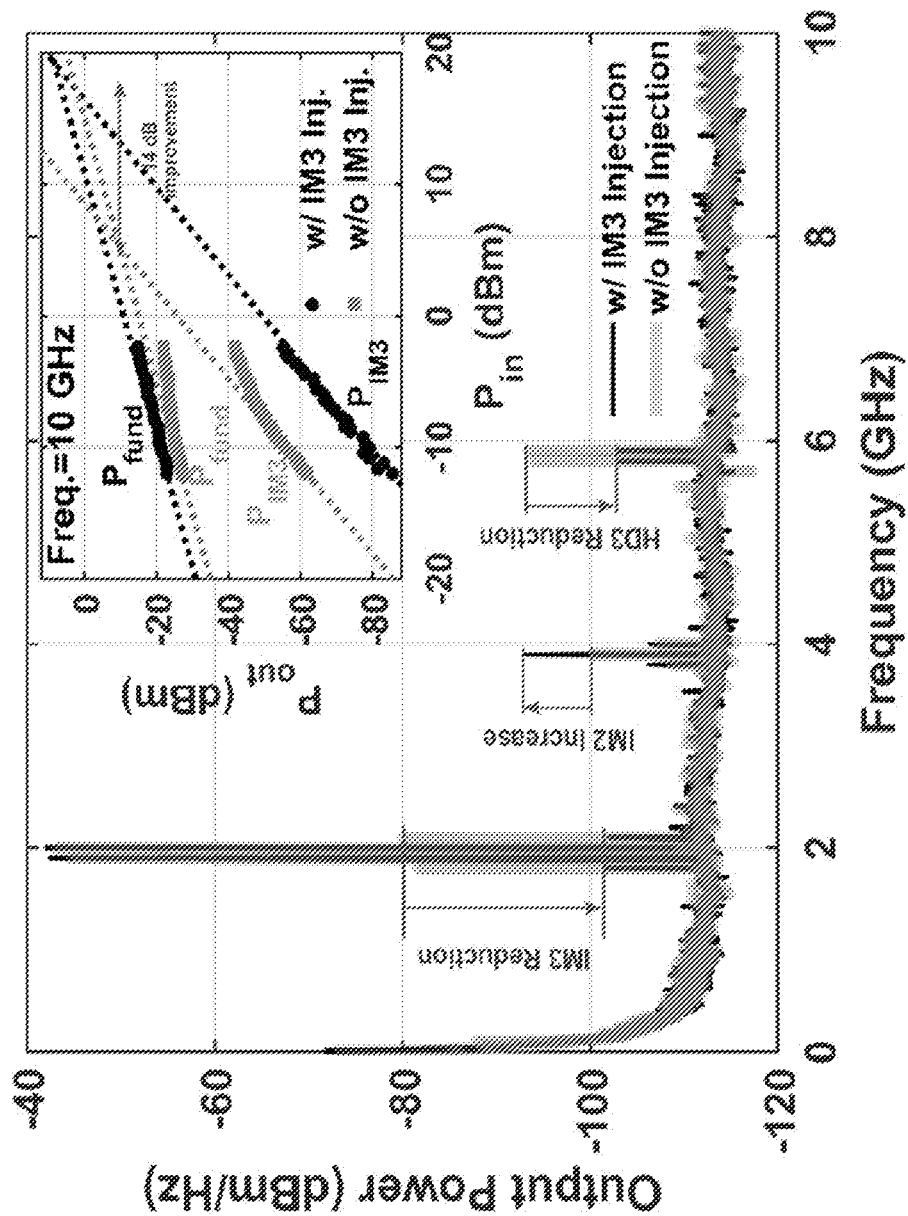
FIG. 4 is the measured output power spectrum of preferred embodiment consistent with FIG. 2E and a 4-segment MZM for two sinusoidal tones at 1.9 and 2 GHz applied to the input of the driver, and input power sweep at 10 GHz with and without IM2 injection.

FIG. 4 plots the measured output power spectrum for two sinusoidal tones at 1.9 and 2 GHz. The IM3 components decrease by more than 23 dB while an IM2 term at 3.9 GHz increases by 8 dB. Additionally, the HD3 components are reduced by 10 dB. The IM2 injection does not produce any undesired IMO components. The inset figure shows the input power sweep at 10 GHz and indicates the IIP3 improvement of 14 dB.

Figure 5A:
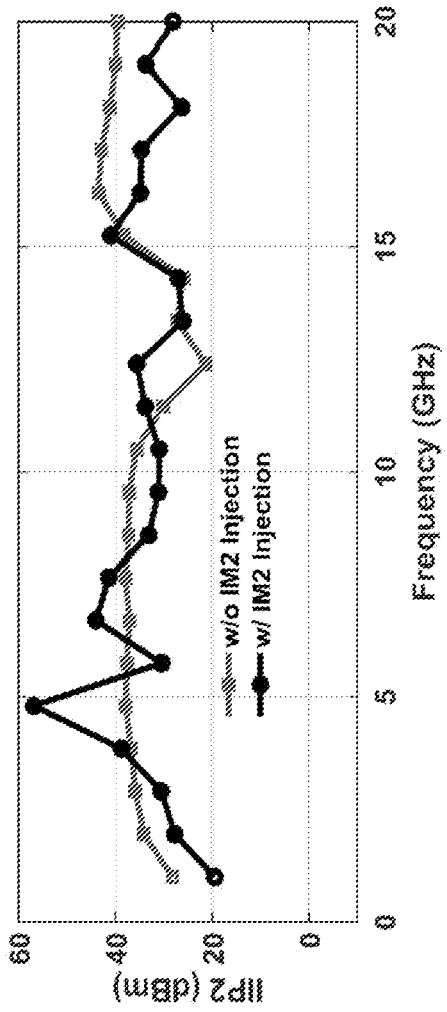
FIGS. 5A and 5B are measured IIP2 versus frequency before and after IM2 injection (FIG. 5), and measured IIP3 versus frequency with and without IM2 injection at two bias points (FIG. 5B)
Figure 5B:
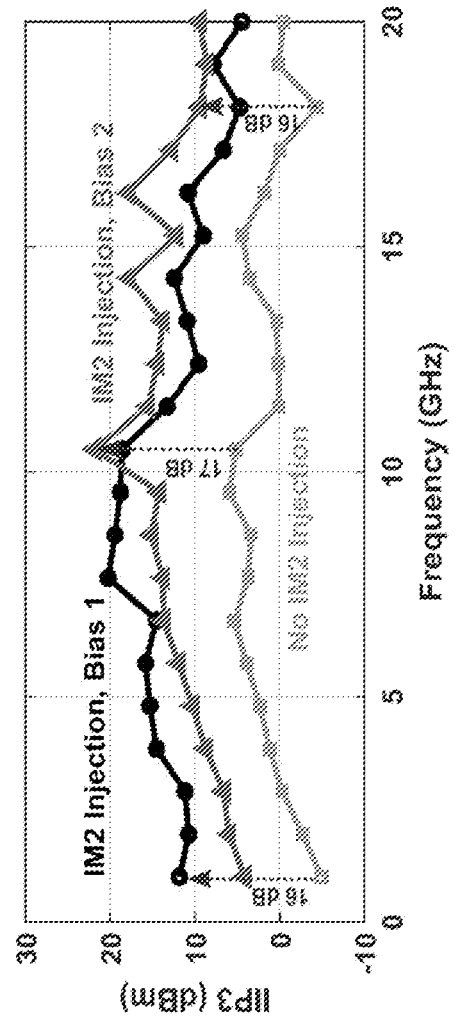

The wideband improved IIP3 is shown in FIG. 5A with and without IM2 injection at two different bias points. Over the entire 1-20 GHz range, the IIP3 is increased relative to the driver without IM2 injection with maximum improvement of 17 dB. The bias on the IM2 injection can be adjusted to achieve higher IIP3 improvement above and below 10 GHz. Additionally, the IIP2 (second order intercept point) is measured in FIG. 5B before and after IM2 injection. Notably, IIP2 does not substantially change over the frequency range with IM2 injection. However, the results indicate an IIP2 improvement of more than 20 dB at 5 GHz.

FIG. 6A plots the measured NF compared to the NF of a Si-based TW-MZM. The driver improves the NF by more than 20 dB with a minimum 13.6 dB NF at 3 GHz. FIG. 6B shows a signal constellation diagram illustrating 64-QAM signal constellation at 2 GS/s with carrier at 11 GHz. This proves the linearized optical link is capable of transmitting complex modulation formats at high data rates. From the measured IIP3 and NF in FIG. 6C, the SFDR is 120 dB·Hz⅔ at 10.5 GHz, a 19 dB improvement over earlier work and 22 dB improvement at 17 GHz. The power consumption of the driver is 1.75 W (438 mW per stage) without IM2 injection and increases by 60 mW with the use of IM2 injection to provide the 10-20 dB IIP3 improvement. The driver chip area was 3.95×1.38 mm² and SiP S-MZM area was 5.5×0.65 mm², respectively.

The example experimental embodiment according to FIG. 2F provides the highest RoF link known to the present inventors with SFDR of up to 120 dB·Hz⅔ and operating up to 20 GHz. Embodiments provide the first co-designed analog predistortion SiGe LNA and segmented SiP MZM with an effective approach to cancel IM3 distortion generated by the SiP MZM. Embodiments of the invention demonstrate SiP MZMs are capable of meeting high-performance criteria for RoF links and meets or surpasses commercial LiNbO₃ and InP MZM performance.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A predistorter for an electro-optical converter, comprising:
    a plurality of low noise RF amplifiers distributed along a transmission line that receive an RF input;
    second order intermodulation injection (IM2) circuitry comprising an inductively-degenerated frequency doubler to square and filter IM2 products of the RF input;
    a Mach-Zehnder Modulator (MZM); and
    feed forward circuitry for injection of IM2 to independently propagate RF intermodulation components with velocity matching to the MZM;
    and at least one driver to inject the RF input and RF intermodulation components into the MZM.

2. The predistorter of claim 1, wherein the MZM is a segmented MZM (Seg-MZM), the predistorter comprising a plurality of drivers to inject the RF intermodulation components into different segments of the Seg-MZM.

3. The predistorter of claim 1, comprising a mixer that mixes a second order distortion of the RF input with a fundamental of the RF input to generate a third order distortion (IM3) of the RF input, wherein the feed forward circuitry drives IM3 injection.

4. The predistorter of claim 3, further comprising circuitry to square and low-pass filter the RF input to generate the second order distortion.

5. The predistorter of claim 3, further comprising circuitry to weight the third order distortion.

6. The predistorter of claim 3, wherein the feed forward circuitry weights IM3 according to $$OIP3 \cong \frac{2R_L(I_{EE} + I_{BIAS})}{\sqrt{\left|\frac{3I_{BIAS}}{I_{EE} + I_{BIAS}} - 1\right|}}$$

where $I_{BIAS}$ is the DC current through a circuit to generate the second order distortion, $I_{EE}$ is the DC current of the differential driver stage, RL is the output load resistance.

7. An electro-optical converter comprising a predistorter of claim 1, wherein the MZM comprises a segmented MZM and the second order intermodulation injection (IM2) circuitry generates a predistorted signal that is applied to the segmented MZM.

8. The electro-optical converter of claim 7, wherein each segment of the segmented MZM comprises differential p-i-n optical phase shifter to confine the optical field in the waveguide and linearize the MZM response through a combination of plasma dispersion and Kerr effect modulation.

9. The converter of claim 8, wherein the MZM is implemented in a silicon and the wave guide is a p-i-n phase shifter waveguide.

10. The converter of claim 8, wherein the driver circuit comprises an active balun.

11. The converter of claim 10, wherein the active balun produces differential RF signals with less than 1 dB gain of mismatch over an operational range.

12. The converter of claim 1, wherein the RF input has a broadband operational range and the second order intermodulation injection (IM2) circuitry generates predistortion to correct the RF input over more than an octave.

13. A method for linearizing an electro-optical conversion, the method comprising steps of:
    receiving a radio frequency (RF) signal;
    distributing amplification along a single-ended transmission line, wherein a delay of the transmission line is matched to group velocity of light in a Mach-Zehnder Modulator (MZM), and
    generating second order intermodulation injection (IM2), independently propagating RF intermodulation components with a velocity matching with the MZM and injecting the RF signal and the RF intermodulation components into the MZM.

14. The method of claim 13, wherein receiving comprises tapping the RF signal from a travelling wave line, buffering the tapped signals; splitting the buffered signal between two paths, wherein in one path the RF signal is amplified and in an auxiliary path the RF signal is squared and low-pass filtered to generate a low-frequency IM2 component, mixing the IM2 component with the original RF signal to generate an IM3 component, and weighting the IM3 component to cancel IM3.

15. The method of claim 13, wherein said generating generates the intermodulation components over more than an octave of the RF signal bandwidth.

* * * * *